United States Patent
Oishi et al.

(10) Patent No.: US 9,865,452 B2
(45) Date of Patent: Jan. 9, 2018

(54) SUBSTRATE PROCESSING METHOD AND SUBSTRATE PROCESSING APPARATUS

(71) Applicant: Tokyo Electron Limited, Tokyo (JP)

(72) Inventors: Kotaro Oishi, Kumamoto (JP);
Keisuke Egashira, Kumamoto (JP);
Kouzou Tachibana, Kumamoto (JP);
Hideaki Udou, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 31 days.

(21) Appl. No.: 15/084,789

(22) Filed: Mar. 30, 2016

(65) Prior Publication Data
US 2016/0300710 A1 Oct. 13, 2016

(30) Foreign Application Priority Data
Apr. 7, 2015 (JP) .................................. 2015-078230

(51) Int. Cl.
*H01L 21/02* (2006.01)
*H01L 21/67* (2006.01)

(52) U.S. Cl.
CPC .. *H01L 21/02057* (2013.01); *H01L 21/67017* (2013.01); *H01L 21/67028* (2013.01)

(58) Field of Classification Search
CPC ......... H01L 21/02057; H01L 21/67028; H01L 21/67034; H01L 21/67051; B08B 3/10
See application file for complete search history.

(56) References Cited

U.S. PATENT DOCUMENTS

2012/0164339 A1* 6/2012 Nakamori ........... H01L 21/6708
427/401

FOREIGN PATENT DOCUMENTS

| JP | 2012-222329 A | 11/2012 |
| JP | 2013-118347 A | 6/2013 |

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Disclosed is a substrate processing method that includes a water-repellency step, a rinse step, and a dry step. In the water-repellency step, a water-repellent agent which is heated to a first predetermined temperature and then reaches a second predetermined temperature lower than the first predetermined temperature, is supplied to a substrate. In the rinse step, a rinse liquid is supplied to the substrate after the water-repellency step. In the dry step, the rinse liquid on the substrate after the rinse step is removed.

11 Claims, 8 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2015-078230 filed on Apr. 7, 2015 with the Japan Patent Office, the disclosure of which is incorporated herein in its entirety by reference.

TECHNICAL FIELD

Exemplary embodiments disclosed herein relate to a substrate processing method and a substrate processing apparatus.

BACKGROUND

Conventionally, for example, in a cleaning processing in a substrate processing apparatus, there is a case in which a rinse processing is performed by supplying a rinse liquid to a substrate, and then, the substrate is dried. When the substrate is dried, the surface tension of the rinse liquid may act on patterns of the substrate, resulting in pattern collapse.

Thus, a technique of suppressing the pattern collapse has recently been known, in which a water-repellency processing is performed on the substrate by supplying a water-repellent agent to the substrate prior to a rinse processing, so that a reduced force from the rinse liquid acts on the pattern of the substrate during the drying of the substrate (see, e.g., Japanese Patent Laid-Open Publication No. 2012-222329).

Further, the conventional technique heats the water-repellent agent to a relatively high temperature and always heats the water-repellent agent so as to supply the water-repellent agent to the substrate while maintaining the high temperature state so that the water-repellency of the substrate can be promoted, thereby shortening the time required for the water-repellency.

SUMMARY

A substrate processing method according to an aspect of the exemplary embodiment includes a water-repellency step, a rinse step, and a dry step. In the water-repellency step, a water-repellent agent which was heated to a first predetermined temperature and has reached a second predetermined temperature lower than the first predetermined temperature, is supplied to a substrate. In the rinse step, a rinse liquid is supplied to the substrate after the water-repellency step. In the dry step, the rinse liquid on the substrate after the rinse step is removed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
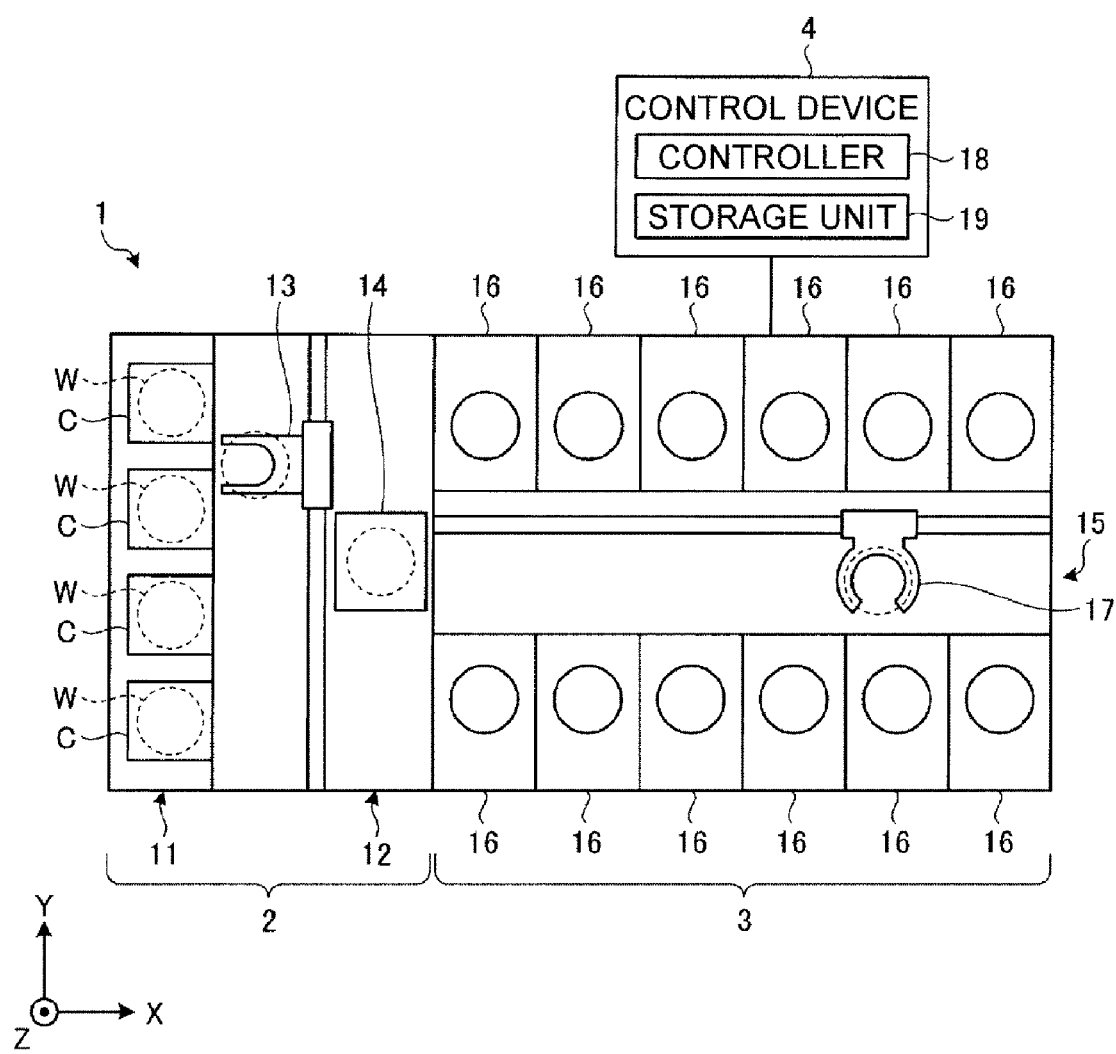
FIG. 1 is a view illustrating a schematic configuration of a substrate processing system according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional technique, a water-repellent agent maintained at a high temperature flows in the substrate processing apparatus. Thus, the atmospheric temperature in the substrate processing apparatus may be changed and become unstable.

In an aspect of an exemplary embodiment, an object is to provide a substrate processing method and a substrate processing apparatus which are able to suppress pattern collapse of a substrate as well as constantly maintain the atmospheric temperature in the substrate processing apparatus.

A substrate processing method according to an aspect of the exemplary embodiment includes a water-repellency step, a rinse step, and a dry step. In the water-repellency step, a water-repellent agent which is heated to a first predetermined temperature and then reaches a second predetermined temperature lower than the first predetermined temperature, is supplied to a substrate. In the rinse step, a rinse liquid is supplied to the substrate after the water-repellency step. In the dry step, the rinse liquid on the substrate after the rinse step is removed.

The above-described substrate processing method further includes a cooling step of cooling the water-repellent agent heated to the first predetermined temperature, to the second predetermined temperature, before the water-repellency step.

The above-described substrate processing method further includes a heating step of heating the water-repellent agent to the first predetermined temperature, before the water-repellency step.

In the above-described substrate processing method, the second predetermined temperature is normal temperature.

A substrate processing apparatus according to another aspect of the exemplary embodiment includes: a water-repellent agent supply unit configured to supply a water-repellent agent to a substrate; a rinse supply unit configured to supply a rinse liquid to the substrate; and a controller configured to perform a water-repellency processing of supplying a water-repellent agent which is heated to a first predetermined temperature and then reaches a second predetermined temperature lower than the first predetermined temperature, to a substrate; a rinse processing of supplying a rinse liquid to the substrate after the water-repellency processing; and a dry processing of removing the rinse liquid on the substrate after the rinse processing.

The above-described substrate processing apparatus further includes a pipe connected to the water-repellent agent supply unit, and configured to supply the water-repellent agent to the water-repellent agent supply unit; and a cooling unit provided in the pipe, and configured to cool the water-repellent agent. The controller causes the cooling unit to cool the water-repellent agent heated to the first predetermined temperature, to the second predetermined temperature.

The above-described substrate processing apparatus further includes a processing unit in which the water-repellent agent supply unit is accommodated and the water-repellency processing is performed. The cooling unit is provided in the pipe within the processing unit.

The above-described substrate processing apparatus further includes a processing unit in which the water-repellent agent supply unit is accommodated and the water-repellency processing is performed. The cooling unit is provided in the pipe between the water-repellent agent source and the processing unit.

The above-described substrate processing apparatus further includes a reservoir provided in the pipe between the water-repellent agent source and the processing unit, and configured to reserve the water-repellent agent supplied from the water-repellent agent source. The cooling unit is provided in the reservoir.

The above-described substrate processing apparatus further includes a pipe connected to the water-repellent agent supply unit, and configured to supply the water-repellent agent to the water-repellent agent supply unit; and a heating unit provided in the pipe, and configured to heat the water-repellent agent. The controller causes the heating unit to heat the water-repellent agent to the first predetermined temperature.

The above-described substrate processing apparatus further includes a processing unit in which the water-repellent agent supply unit is accommodated and the water-repellency processing is performed. The heating unit is provided in the pipe between the water-repellent agent source and the processing unit.

The above-described substrate processing apparatus further includes a reservoir provided in the pipe between the water-repellent agent source and the processing unit, and configured to reserve the water-repellent agent supplied from the water-repellent agent source. The heating unit is provided in the reservoir.

In the above-described substrate processing apparatus, the second predetermined temperature is normal temperature.

According to an aspect of the exemplary embodiment, it is possible to suppress pattern collapse of the substrate as well as constantly maintain the atmospheric temperature in the substrate processing apparatus.

Hereinafter, exemplary embodiments of a substrate processing method and a substrate processing apparatus disclosed herein will be described in detail with reference to the accompanying drawings. Further, the present disclosure is not limited to the following exemplary embodiments.

<1. Configuration of Substrate Processing System>

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
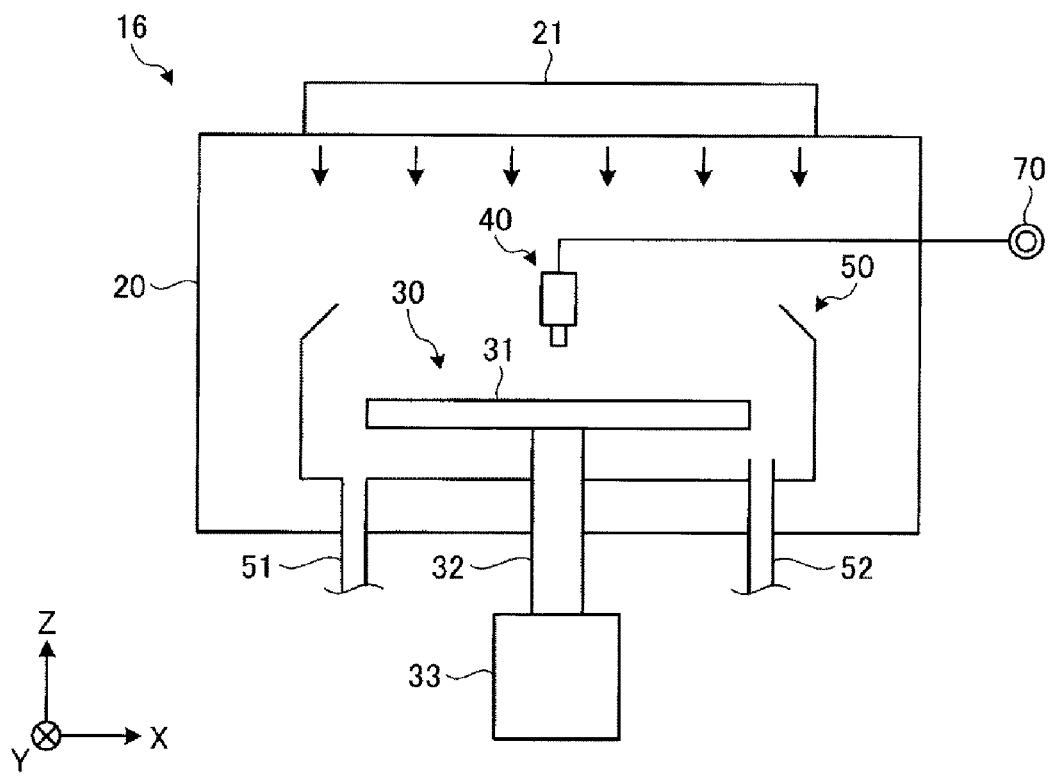
FIG. 2 is a view illustrating a schematic configuration of a processing unit.

Next, a specific configuration of the processing unit 16 will be described with reference to FIG. 2. FIG. 2 is a view illustrating a schematic configuration of a processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

For example, the processing unit 16 according to the present exemplary embodiment performs various liquid processings on the wafer W by ejecting various processing liquids to the wafer W, and then performs a dry processing to remove liquid remaining on the wafer W.

Figure 3:
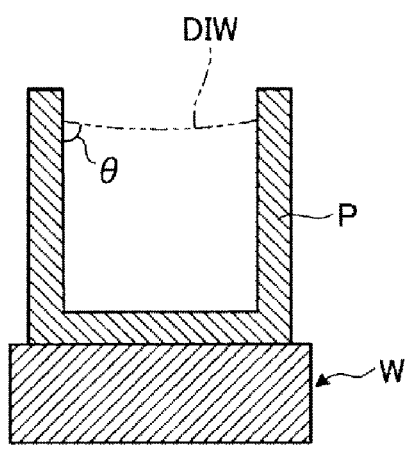
FIG. 3 is a view for explaining a dry processing of a wafer.

However, there was a case in which, when a wafer W is dried, the patterns formed on the wafer W are collapsed. FIG. 3 is a view for explaining a dry processing of the wafer W, and an enlarged cross-sectional schematic view of the wafer W.

Specifically, as illustrated in FIG. 3, the dry processing is initiated in a state where a processing liquid (for example, deionized water (DIW) indicated by an imaginary line) remains between patterns P on the wafer W. At this time, a force trying to collapse the patterns P may act on the patterns P, thereby causing pattern collapse.

Therefore, for example, when a water-repellency processing is performed by supplying a water-repellent agent to the wafer W in advance, the processing liquid is dried while maintaining the contact angle θ with the patterns P at approximately 90°. Accordingly, the collapsing force acting on the patterns P by the processing liquid may be reduced so that the collapse of the patterns P may be suppressed.

Further, always heating the water-repellent agent to a relatively high temperature and supplying the heated water-repellent agent to the wafer W while maintaining the high temperature state may be considered in order to promote the water-repellency of the wafer W, thereby shortening the time required to impart the water-repellency. However, with the above-described configuration, there is a concern that, for example, the atmospheric temperature in the substrate processing system 1 may become unstable by being changed by the high-temperature water-repellent agent.

Therefore, the substrate processing system 1 according to the present exemplary embodiment has a configuration capable of suppressing the pattern P collapse of the wafer W and constantly maintaining the atmosphere within the substrate processing system 1. Hereinafter, detailed descriptions will be made in this regard.

Figure 4:
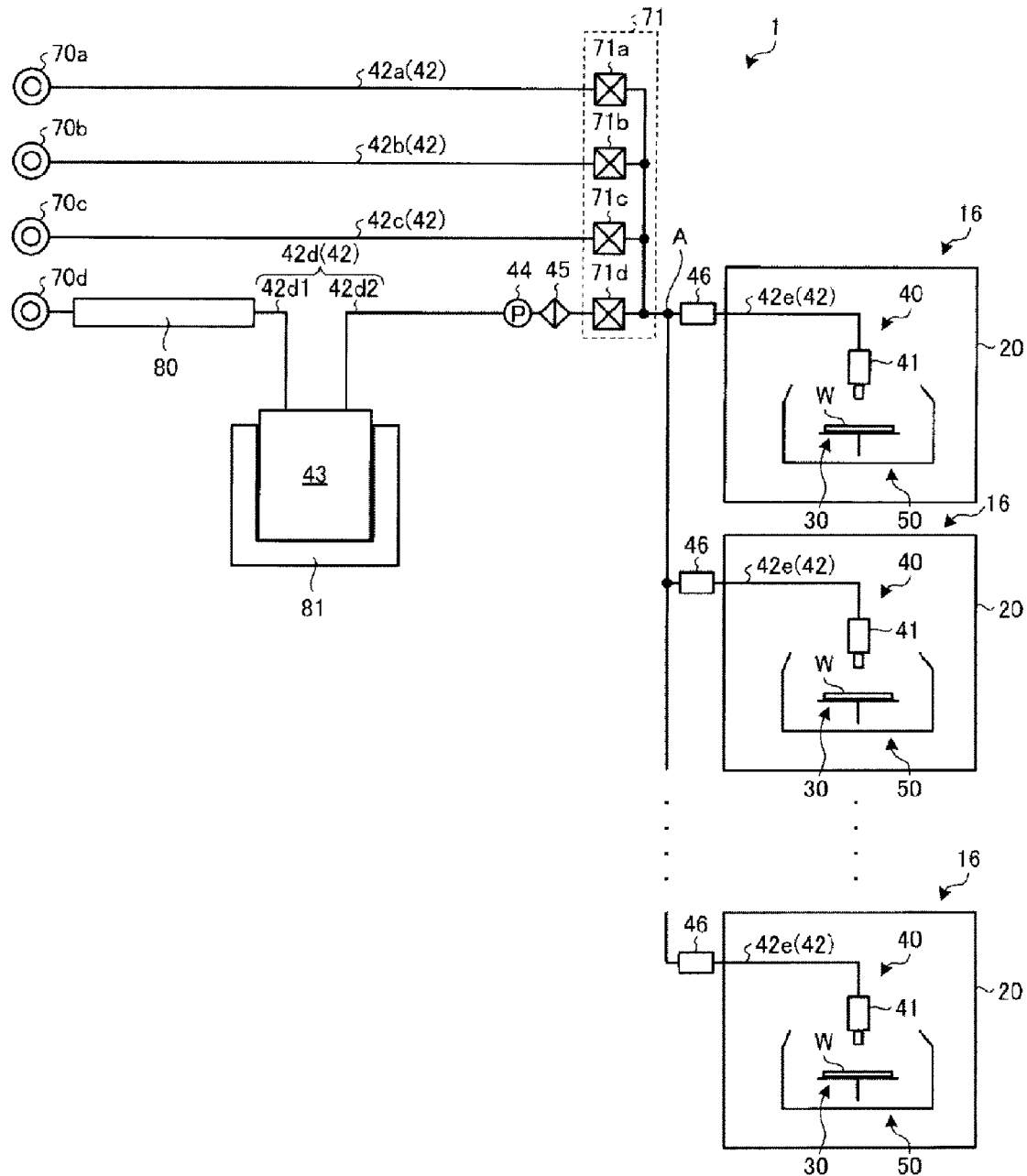
FIG. 4 is a view illustrating a specific configuration example of a substrate processing system.

First, a specific configuration of the substrate processing system 1 including the processing unit 16 will be described with reference to FIG. 4. FIG. 4 is a schematic view illustrating a configuration example of the substrate processing system 1. Further, the substrate processing system 1 is an example of the substrate processing apparatus, and the processing unit 16 is an example of the processing unit.

The processing unit 16 of the substrate processing system 1 performs a series of cleaning processing including, for example, cleaning, water-repellency-imparting, and drying of the wafer W. Further, a predetermined substrate processing performed in the processing unit 16 is not limited to the cleaning processing, but may be other kinds of processings such as, for example, a development processing or an etching processing.

As illustrated in FIG. 4, each of the plurality of processing units 16 is provided with a processing fluid supply unit 40. The processing fluid supply unit 40 is provided with a nozzle 41 and a pipe 42, one end of which is connected to the nozzle 41. The nozzle 41 is accommodated in the chamber 20 of the processing unit 16, and is arranged at, for example, a position facing the wafer W.

The other ends of the pipes 42 extending from the nozzles 41 of the respective processing units 16 are joined once with each other in the outside of the chamber 20 of the processing unit 16, and then branched into a plurality of pipes via a multi-communication switching valve 71. Further, in FIG. 4, the position where the pipe 42 is merged is denoted by a symbol "A."

The multi-communication switching valve 71 includes a chemical liquid valve 71*a*, an isopropyl alcohol (IPA) valve 71*b*, a rinse liquid valve 71*c*, and a water-repellent agent valve 71*d*.

In addition, the pipes 42 branched from the multi-communication switching valve 71 are connected to a chemical liquid source 70*a*, an IPA source 70*b*, a rinse liquid source 70*c*, and a water-repellent source 70*d* via the chemical liquid valve 71*a*, the IPA valve 71*b*, the rinse liquid valve 71*c*, and the water-repellent agent valve 71*d*, respectively.

Hereinafter, in some cases, the pipe 42 connected to the chemical source 70*a* is referred to as a "pipe 42*a*." Similarly, in some cases, the pipe 42 connected to the IPA source 70*b* is referred to as a "pipe 42*b*," the pipe 42 connected to the rinse liquid source 70*c* is referred to as a "pipe 42*c*," and the pipe 42 connected to the water-repellent agent source 70*d* is described as a "pipe 42*d*." In addition, in some cases, the portion of each pipe 42 positioned in each processing unit 16 is referred to as a "pipe 42*e*."

Therefore, each processing fluid supply unit 40 ejects a chemical liquid supplied from the chemical liquid source 70*a* through the pipe 42*a*, IPA supplied from the IPA source 70*b* through the pipe 42*b*, a rinse liquid supplied from the rinse liquid source 70*c* through the pipe 42*c*, and a water-repellent agent supplied from the water-repellent source 70*d* through the pipe 42*d*, from the nozzle 41 to the wafer W. The processing fluid supply unit 40 is an example of the water-repellent agent supply unit or the rinse supply unit.

Here, descriptions was made on the case where the processing fluid supply unit 40 is provided with one nozzle 41 in each processing unit 16, but the processing fluid supply unit 40 may be provided with a plurality of nozzles corresponding to the respective processing liquids. That is, in each processing unit 16, the processing fluid supply unit 40 may be provided with a nozzle connected to the chemical liquid source 70a to eject the chemical liquid, a nozzle connected to the IPA source 70b to eject the IPA, a nozzle connected to the rinse liquid 70c to eject the rinse liquid, and a nozzle connected to the water-repellent agent source 70d to eject the water-repellent agent.

For example, when the cleaning processing is performed in the processing unit 16, the chemical liquid may be, for example, dilute hydrofluoric acid (DHF), which is a kind of cleaning liquid, but not limited thereto.

Further, the IPA source 70b is not limited thereto, but a source of a volatile solvent other than the IPA may be used instead of the IPA source 70b. Further, the rinse liquid may be, for example, DIW, but not limited thereto. Other kinds of rinse liquid may be used.

Further, the water-repellent agent is obtained by diluting, for example, a water-repellent agent for imparting water-repellency to the surface of the wafer W, with a thinner to a predetermined concentration. Here, the water-repellent agent may be a silylating agent (or a silane coupling agent). Specific examples of the water-repellent agent may include trimethylsilyldimethylamine (TMSDMA), dimetylsilyldimethylamine (DMSDMA), trmethylsilyldiethylamine (TMSDEA), hexamethyldisilazane (HMDS), and 1,1,3,3-tetramethyldisilazane (TMDS).

Further, the thinner may be an ether-based solvent, or a ketone-based organic solvent. Specific examples of the thinner may include propylene glycol monomethyl ether acetate (PGMEA), cyclohexanone, and hydrofluluroether (HFE).

The substrate processing system 1 further includes a reservoir 43, a pump 44, a filter 45, a flow rate adjustor 46, a heating unit 80, and a cooling unit 81. The reservoir 43 is provided in the middle of the pipe 42d between the water-repellent agent source 70d and the processing unit 16 to temporarily reserve the water-repellent agent supplied from the water-repellent agent source 70d.

As described above, when the reservoir 43 is provided in the middle of the pipe 42d, for example, a water-repellent agent which undergoes rapid pressure change or pulsation may be suppressed from being supplied from the water-repellent source 70d to the nozzle 41.

The reservoir 43 may be, for example, a buffer tank, but not limited thereto. Further, in the example illustrated in FIG. 4, the reservoir 43 is provided in the pipe 42d, but not limited thereto. For example, the pipes 42a to 42c may also be provided with a reservoir.

Hereinafter, the upstream side of the reservoir 43 in the pipe 42d, that is, the water-repellent source 70d side may be referred to as an "upstream pipe 42d1," and a downstream side of the reservoir 43, that is, the processing unit 16 side may be referred to as a "downstream pipe 42d2."

The pump 44 is provided in the downstream pipe 42d2 to send the water-repellent agent of the reservoir 43 to the processing unit 16. Further, the filter 45 is provided at the downstream side of the pump 44 in the downstream pipe 42d2 to remove foreign matters such as, for example, particles contained in the water-repellent agent.

The flow rate adjustor 46 is provided between the multi-communication switching valve 71 and the processing unit 16 in the downstream pipe 42d2. Further, the flow rate adjustor 46 is provided in each processing unit 16 to adjust the flow rate of the water-repellent agent or the chemical liquid supplied to the corresponding processing unit 16.

The heating unit 80 is provided in the pipe 42d to heat the water-repellent agent. In particular, the heating unit 80 is provided in the upstream pipe 42d1 of the pipe 42d between the water-repellent source 70d and the processing unit 16 to heat the water-repellent agent before being supplied to the reservoir 43. Specifically, the heating unit 80 heats the water-repellent agent up to a first predetermined temperature which is set in advance.

The first predetermined temperature may be set to an arbitrary value, for example, a value higher than normal temperature and lower than the boiling point of the water-repellent agent. Specifically, the first predetermined temperature may be about 30° C. to 70° C. Further, the normal temperature is, for example, room temperature in the place where the substrate processing system 1, but not limited thereto.

The heating unit 80 may be, for example, a temperature adjustor. The temperature adjustor includes a pipeline through which a liquid such as, for example, water is circulated, and adjusts the temperature of the water-repellent agent to a predetermined temperature (here, the first predetermined temperature) by performing heat exchange between the liquid flowing through the pipeline and the water-repellent agent flowing through the pipe 42d. Further, the heating unit 80 is not limited to the temperature adjustor, but may be, for example, another heating mechanism such as, for example, an electric heater.

The cooling unit 81 is provided in the pipe 42d to cool the water-repellent agent. Specifically, the cooling unit 81 is provided at the downstream side of the heating unit 80 in the pipe 42d. More specifically, the cooling unit 81 is provided in the reservoir 43 in the middle of the pipe 42d.

Then, the cooling unit 81 cools the water-repellent agent reserved in the reservoir 43. Specifically, the cooling unit 81 cools the water-repellent agent to a second predetermined temperature. The second predetermined temperature may be set to an arbitrary value lower than the first predetermined temperature, for example, normal temperature.

Similarly to the heating unit 80, the cooling unit 81 may be, for example, a temperature adjustor. The temperature adjustor adjusts the temperature of the water-repellent agent to a predetermined temperature (here, the second predetermined temperature) by performing heat exchange between the liquid flowing through the pipeline and the water-repellent in the reservoir 43. Further, the cooling unit 81 is not limited to the above-described water-cooling temperature adjustor, but may be, for example, another cooling mechanism such as, for example, an air-cooling temperature adjustor.

As described above, the water-repellent agent supplied from the water-repellent source 70d is heated up to the first predetermined temperature in the heating unit 80, and then, cooled down to the second predetermined temperature in the cooling unit 81. Then, the water-repellent agent of the second predetermined temperature is supplied from the nozzle 41 to the wafer W.

Therefore, in the substrate processing system 1 according to the present exemplary embodiment, the water-repellency of the water W may be promoted, thereby shortening the time required for the water-repellency.

Specifically, upon comparing the above-described case with, for example, a case where the water-repellent agent is supplied while remaining at normal temperature, that is, without being heated, it was necessary to supply the water-repellent agent to the wafer W for about 60 seconds until the wafer W is sufficiently imparted with the water-repellency in the case where the water-repellent agent is supplied while remaining at normal temperature.

The expression "the wafer W is sufficiently imparted with the water-repellency" as used herein means that the water-repellency is imparted to the wafer W to the extent that the wafer W can be dried while maintaining the contact angle θ between the rinse liquid and the patterns P of the wafer W (see FIG. 3) at approximately 90°.

In contrast, the present inventors have found that the wafer W can be sufficiently imparted with the water-repellency by supplying the water-repellent agent, which is cooled after the heating, to the wafer W for 30 seconds. The result is the same as the result of the case where the water-repellent agent is heated to a relatively high temperature, and supplied to the substrate while maintaining the high temperature state.

In this regard, the present inventors have intensively studied and found that, when the water-repellent agent is warmed and then cooled, a solvent such as, for example, a thinner in the water-repellent is volatilized, so that the concentration of, for example, the silylating liquid component or the activating agent is balanced more satisfactorily than in the case of promoting the water-repellency of the wafer W. Therefore, in the substrate processing system 1 according to the present exemplary embodiment, the water-repellency of the wafer W may be promoted by supplying the water-repellent agent, which is warmed and then cooled, to the wafer W, based on the finding described above.

Further, for example, in a case where a water-repellent agent of a relatively high temperature is supplied to the wafer W, the atmospheric temperature in the substrate processing system 1, including the inside of the chamber 20 of the processing unit 16, may be changed, so that the cleaning processing becomes unstable. In contrast, in the substrate processing system 1 according to the present exemplary embodiment, since the water-repellent agent is cooled to the second predetermined temperature (e.g., normal temperature) in the cooling unit 81 and then supplied to the wafer W, the atmospheric temperature in the substrate processing system 1 such as the inside of the chamber 20 of the processing unit 16 may be constantly maintained. Accordingly, for example, the cleaning processing may be stably performed in the processing unit 16.

Further, for example, when the water-repellent agent maintained at a high temperature flows in the substrate processing system 1, there may be increasing limitations on parts used in the substrate processing system 1. For example, various parts used in the substrate processing system 1 should be made of a heat-resistant material. In contrast, in the substrate processing system 1 according to the present exemplary embodiment, since the water-repellent agent reaches the second predetermined temperature lower than the first predetermined temperature, the pipe 42d at the downstream side of the cooling unit 81 (e.g., the downstream pipe 42d2), or the pump 44, the filter 45, the flow rate adjustor 46, the nozzle 41, and the recovery cup 50 are not required to be made of, for example, a heat-resistant material. As such, the limitation on used parts may be reduced in the substrate processing system 1.

Further, since the heating unit 80 and the cooling unit 81 are provided in the pipe 42d as described above, the water-repellent agent may be easily heated to the first predetermined temperature and then cooled to the second predetermined temperature. Further, since the cooling unit 81 is provided in the reservoir 43 in the middle of the pipe 42d, the water-repellent agent may be securely cooled to the second predetermined temperature and then supplied to the wafer W.

Further, in the present exemplary embodiment, since it is not required to always heat the water-repellent agent by, for example, a heater, the power consumption of the entire substrate processing system 1 may be reduced.

<2. Specific Operations of Substrate Processing>

Next, descriptions will be made on the contents of a predetermined substrate processing performed in the processing unit in the substrate processing system 1 configured as described above, with reference to FIG. 5. Specifically, a substrate cleaning processing is performed in the processing unit 16.

Figure 5:
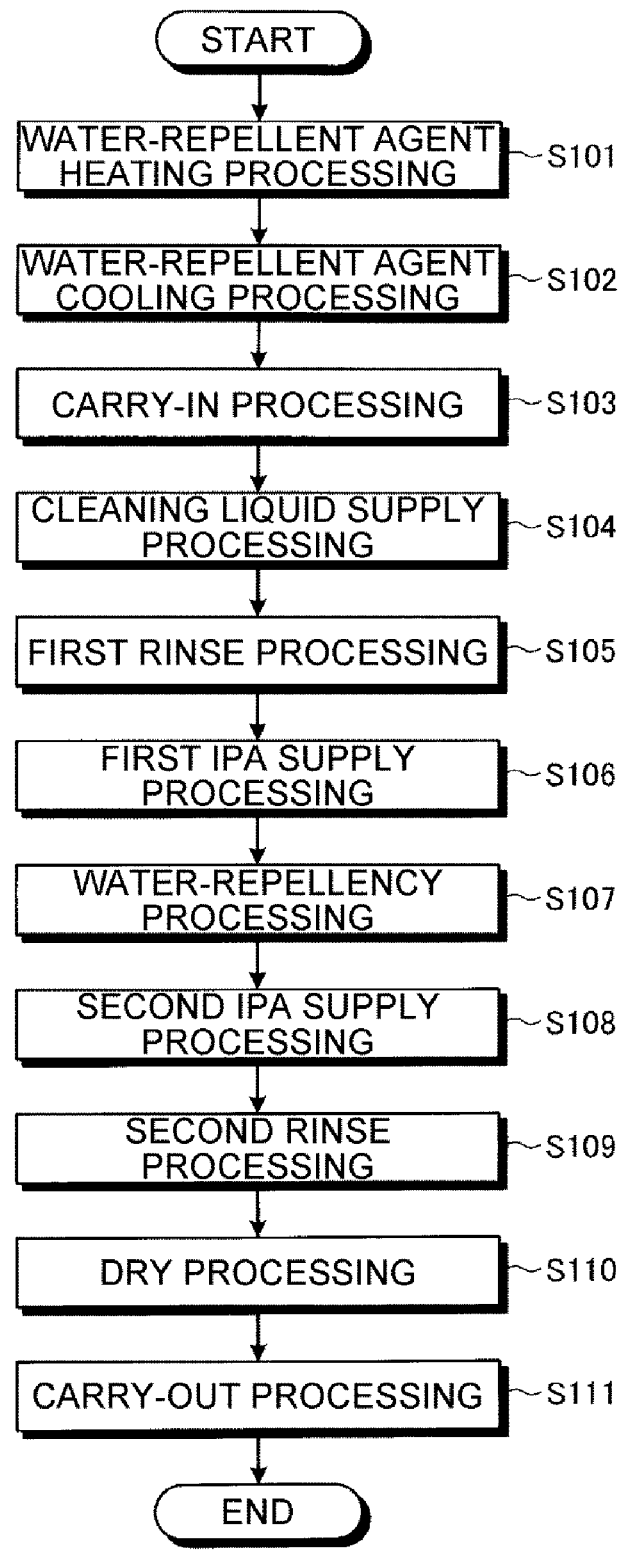
FIG. 5 is a flowchart illustrating a processing procedure of a substrate cleaning processing performed in the processing unit.

FIG. 5 is a flowchart illustrating a processing procedure of the substrate cleaning processing performed in the processing unit 16. Further, the processing procedure of the substrate cleaning processing illustrated in FIG. 5 is executed by reading a program stored in the storage unit 19 of the control device 4 by the controller 18 and controlling the processing unit 16 based on the read instruction.

As illustrated in FIG. 5, the controller 18 first performs a heating processing to heat the water-repellent agent (step S101). In the heating processing, as described above, the water-repellent agent supplied from the water-repellent source 70d is heated to the first predetermined temperature by the heating unit 80.

Subsequently, the controller 18 performs a cooling processing to cool the water-repellent agent (step S102). In the cooling processing, the water-repellent agent, which is heated to the first predetermined temperature and supplied to the reservoir 43, is cooled to the second predetermined temperature by the cooling unit 81.

Here, the heating processing and the cooling processing of the water-repellent agent were first performed, but not limited thereto. That is, the heating processing and the cooling processing of the water-repellent agent may be performed, for example, at any time before a water-repellency processing (to be described later).

Next, the controller 18 carries the wafer W into the chamber 20 of the processing unit 16 by the substrate transfer device 17 (see FIG. 1) (step S103). The wafer W is held by the holding unit 31 (see FIG. 2) in a state where the pattern forming surface faces upward. Thereafter, the controller 18 rotates the holding unit 31 at a predetermined rotation speed.

Subsequently, the controller 18 performs a cleaning liquid supply processing (step S104). Specifically, the controller 18 opens the chemical liquid valve 71a for a predetermined period of time (e.g., 180 seconds) to eject DHF serving as the cleaning liquid from the nozzle 41 toward the rotating wafer W. The DHF supplied to the wafer W is spread over the entire top surface of the wafer W by a centrifugal force attended by the rotation of the wafer W. Thus, the wafer W is cleaned.

Subsequently, the controller 18 performs a first rinse liquid processing (step S105). The controller 18 opens the rinse liquid valve 71c for a predetermined period of time (e.g., 30 seconds) to eject DIW serving as the rinse liquid from the nozzle 41 toward the rotating wafer W. The DIW supplied to the wafer W is spread over the entire top surface of the wafer W by a centrifugal force attended by the rotation of the wafer W. Thus, the DHF remaining on the top surface of the wafer W is washed out with the DIW.

Subsequently, the controller 18 performs a first IPA supply processing (step S106). The controller 18 opens the IPA valve 71b for a predetermined period of time (e.g., 30 seconds) to eject IPA from the nozzle 41 toward the rotating wafer W. The IPA supplied to the wafer W is spread over the entire top surface of the wafer W by a centrifugal force attended by the rotation of the wafer W. Thus, the liquid on the top surface of the wafer W is substituted by the IPA having affinity with the water-repellent agent ejected to the wafer W in the subsequent water-repellency processing. Further, since the IPA also has affinity with the DIW, substitution of DIW with IPA is also facilitated.

Subsequently, the controller 18 performs a water-repellency processing (step S107). The controller 18 opens the water-repellent agent valve 71*d* for a predetermined period of time to eject a silylating agent serving as the water-repellent agent from the nozzle 41 toward the rotating wafer W. The predetermined period of time for opening the water-repellent agent valve 71*d* is set to a time sufficient for imparting the water-repellency to the wafer W, for example, 30 seconds.

The water-repellent agent supplied to the wafer W is spread over the entire top surface of the wafer W by a centrifugal force generated by the rotation of the wafer W. Accordingly, silyl groups are bonded to OH groups of the top surface of the wafer W, so that a water-repellent film is formed on the top surface of the wafer W.

Since the water W is imparted with the water-repellency by performing the water-repellency processing as described above, in the subsequent dry processing, the DIW is dried while maintaining the contact angle θ (see FIG. 3) with the patterns P at approximately 90°. Accordingly, the collapsing force that acts from the DIW onto the patterns P may be reduced, so that the collapse of the patterns P is suppressed.

Subsequently, the controller 18 performs a second IPA supply processing (step S108). The second IPA supply processing is performed in the same procedure as in the first IPA supply processing. Owing to the second IPA supply processing, the water-repellent agent remaining on the top surface of the wafer W is substituted by the IPA.

Subsequently, the controller 18 performs a second rinse liquid processing (step S109). The second rinse processing is performed in the same procedure as in the first rinse processing. Thus, the IPA remaining on the top surface of the wafer W is washed out with the DIW. In the above description, DIW was used as the rinse liquid in the second rinse processing, but not limited thereto. The rinse liquid may be, for example, IPA or a mixed liquid of IPA and DIW.

Here, the second rinse processing is to remove the water-repellent agent remaining on the top surface of the wafer W to enhance the cleanliness of the dried water W. Therefore, when IPA is used as the rinse liquid, the substitution processing of IPA after the water-repellency processing of supplying the water-repellent agent to the wafer W as described above, is substituted by the rinse processing by IPA. When IPA is used as the rinse liquid, the rinse liquid in the second rinse processing is supplied from the IPA source 70*b* through the IPA valve 71*b*. That is, the IPA source 70*b* and the IPA valve 71*b* also function as the rinse supply unit.

When a mixed liquid of IPA and DIW is used as the rinse liquid is, the rinse liquid in the second rinse processing may be supplied by mixing IPA supplied from the IPA source 70*b* through the IPA valve 71*b* and DIW supplied from the rinse liquid source 70*c* through the rinse liquid valve 71*c*.

Subsequently, the controller 18 performs a dry processing (step S110). The controller 18 controls the driving unit 33 of the substrate holding mechanism (see FIG. 2) to increase the rotation speed of the wafer W, so that the DIW on the wafer W is shaken off, thereby drying the wafer W.

Further, when IPA or a mixed liquid of IPA and DIW is used as the rinse liquid, the wafer W is dried by shaking off the IPA or the mixed liquid of IPA and DIW on the wafer W.

Thereafter, the controller 18 performs a carry-out processing (step S111). The controller 18 controls the driving unit 33 (see FIG. 2) to stop the rotation of the wafer W, and then, carries the wafer W out of the processing unit 16 by the substrate transfer device 17 (see FIG. 1). When the carry-out processing is completed, a series of substrate processings on one water W is completed.

As described above, the substrate processing method according to the present exemplary embodiment includes a water-repellency step, a rinse step, and a dry step. In the water-repellency step, a water-repellent agent, which is heated to a first predetermined temperature and then reaches a second predetermined temperature lower than the first predetermined temperature, is supplied to a wafer W. In the rinse step, a rinse liquid is supplied to the wafer W after the water-repellency step. In the dry step, the rinse liquid of the wafer W is removed after the rinse processing.

Accordingly, it is possible to suppress the pattern P collapse of the wafer W and facilitate the imparting of the water-repellency to the wafer W. In addition, it is possible to constantly maintain the atmosphere in the substrate processing system 1 such as, for example, the inside of the chamber 20 of the processing unit 16.

<3-1. First Modification>

In the substrate processing system 1, the places to be provided with the heating unit 80 and the cooling unit 81 are not limited to those illustrated in FIG. 4. Here, descriptions will be made on modifications of the places to be provided with the heating unit 80 and the cooling unit 81 in the substrate processing system 1 according to the exemplary embodiment, with reference to FIGS. 6 to 9.

FIGS. 6 to 9 are schematic views illustrating specific configuration examples of the substrate processing system 1 in first to fourth modifications. Hereinafter, descriptions will be focused on different points with respect to the substrate processing system 1 illustrated in FIG. 4.

Figure 6:
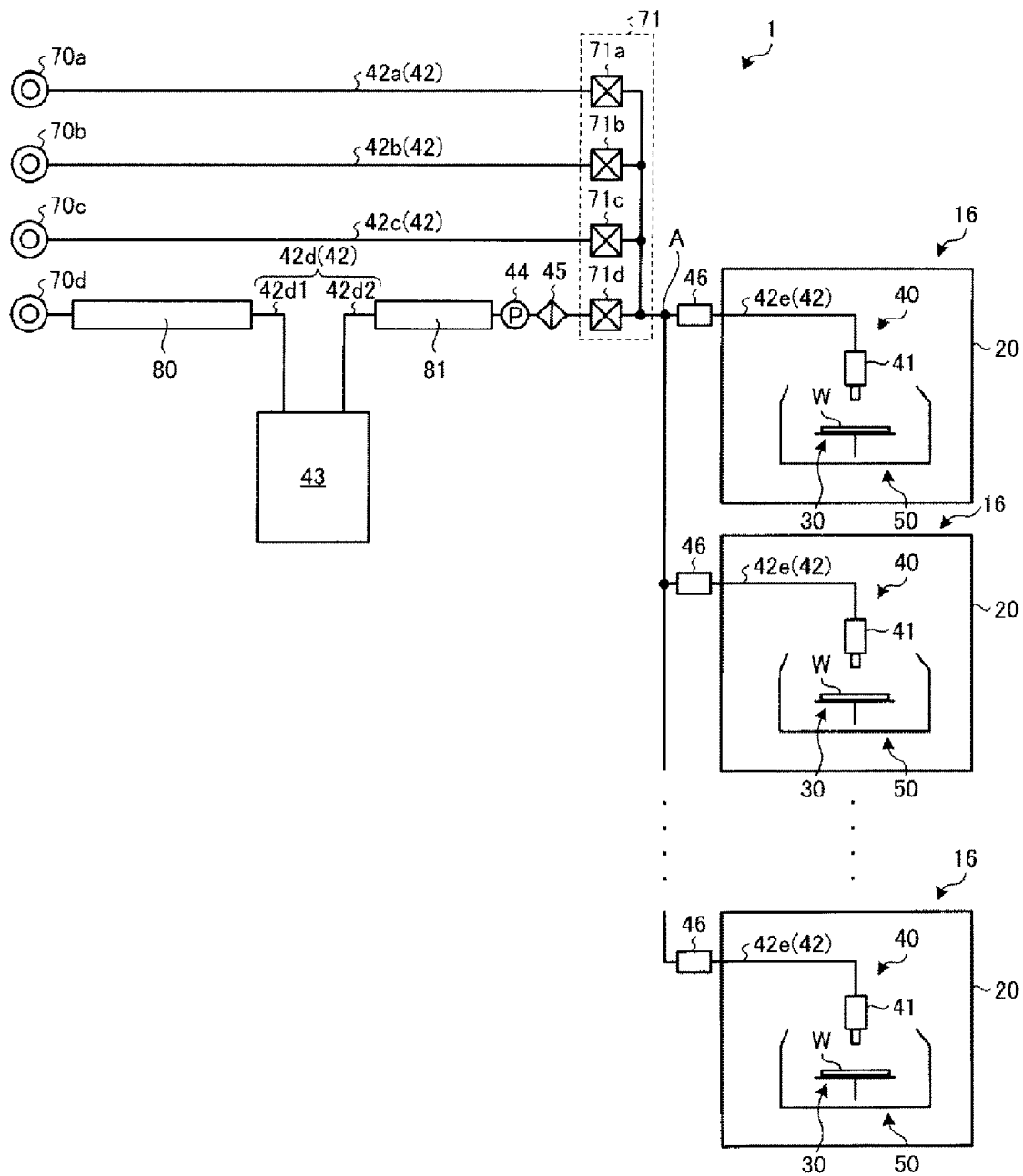
FIG. 6 is a schematic view illustrating a specific configuration example of a substrate processing system in a first modification.

In the first modification, as illustrated in FIG. 6, the cooling unit 81 is provided in the downstream pipe 42*d*2 in the pipe 42*d* and at the upstream side of the pump 44. Therefore, the water-repellent agent may be easily cooled to the second predetermined temperature.

That is, since the water-repellent agent is temporarily reserved in the reservoir 43, the temperature becomes lower than the first predetermined temperature, and the water-repellent agent of the lowered temperature is cooled in the downstream pipe 42*d*2. Therefore, the cooling unit 81 easily cools the water-repellent agent to the second predetermined temperature.

Further, even in the substrate processing system 1 according to the first modification, the pipe 42*d* at the downstream side of the cooling unit 81, or the pump 44, the filter 45, the flow rate adjustor 46, the nozzle 41, and the recovery cup 50 are not required to be made of a heat-resistant material. Therefore, the limitation on parts used may be reduced.

<3-2. Second Modification>

Figure 7:
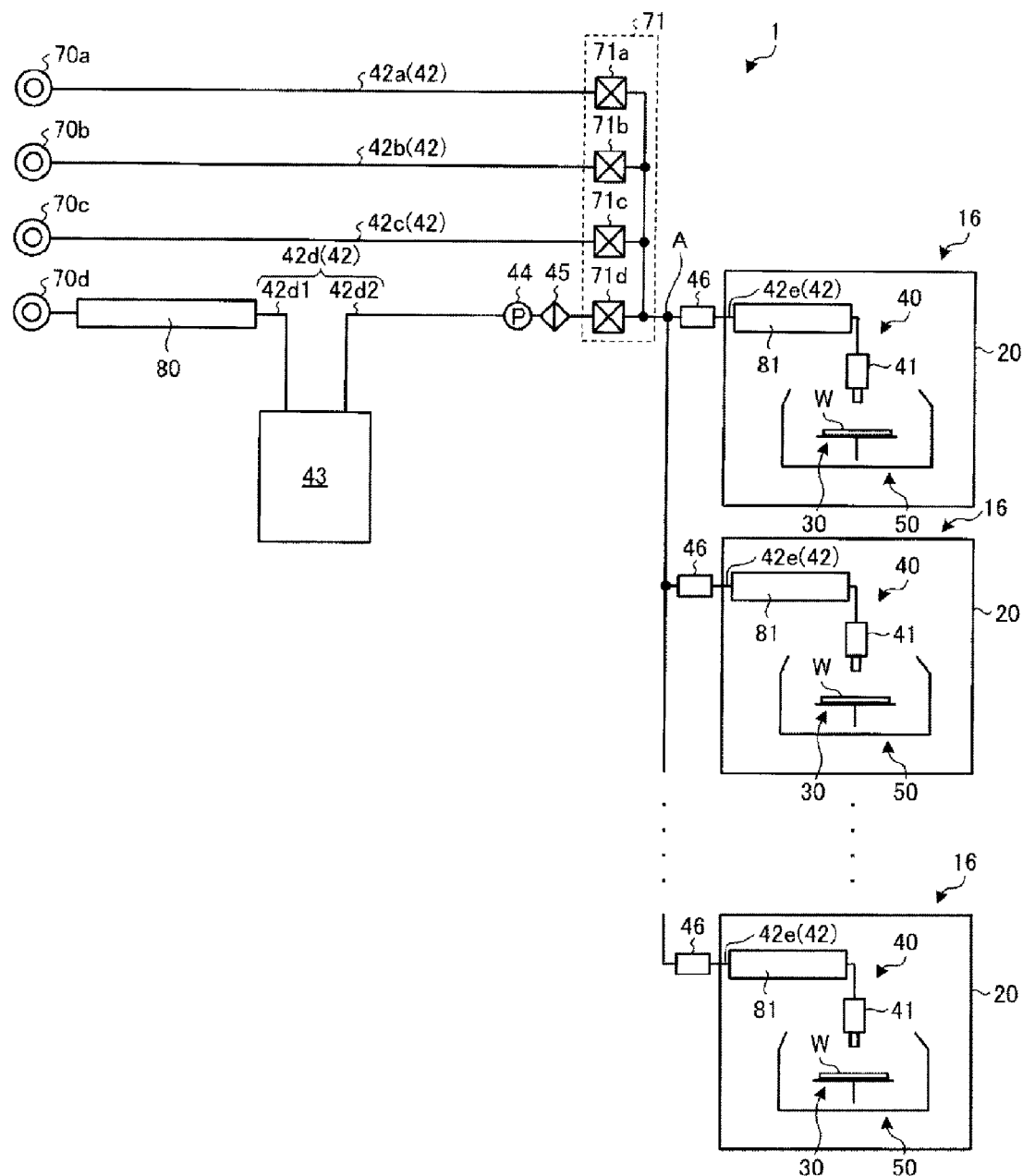
FIG. 7 is a schematic view illustrating a specific configuration example of a substrate processing system in a second modification.

In the second modification, as illustrated in FIG. 7, the cooling unit 81 is provided in a pipe 42*e* within each processing unit 16. Thus, as the water-repellent agent is cooled to the second predetermined temperature in each processing unit 16, it is possible to suppress variation in temperature of the water-repellent agent among the plurality of processing units 16.

Further, in the substrate processing system 1 according to the second modification, the pipe 42*e* at the downstream side of the cooling unit 81, or the nozzle 41 and the recovery cup 50 are not required to be made of a heat-resistant material. Therefore, the limitation on parts used may be reduced.

Further, the cooling processing of the water-repellent agent in the second modification and the fourth modification (to be described later) is performed after the first IPA supply processing (step S106) and before the water-repellency processing (step S107) in the flowchart of FIG. 5.

<3-3. Third Modification>

Figure 8:
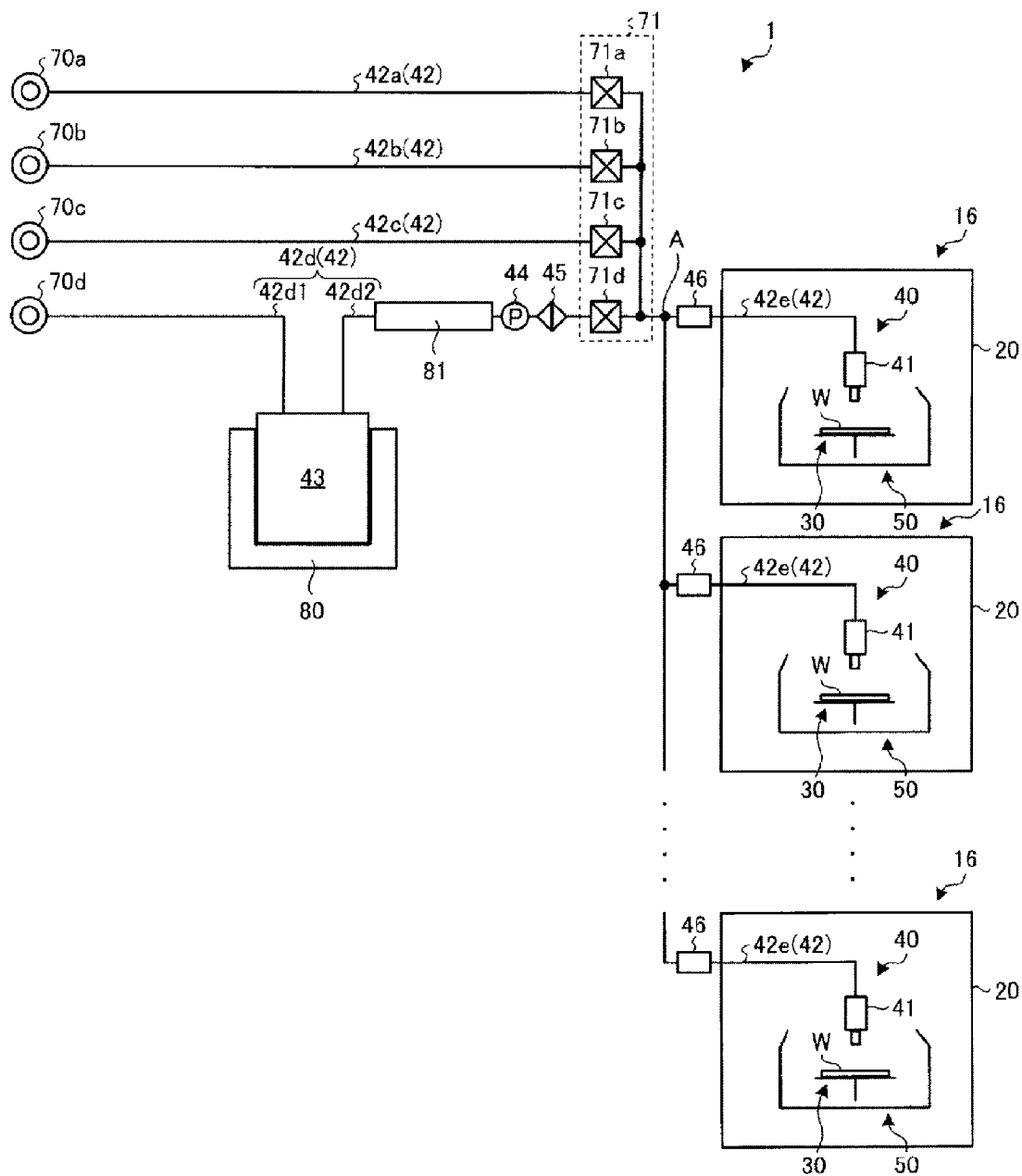
FIG. 8 is a schematic view illustrating a specific configuration example of a substrate processing system in a third modification.

In the third modification, as illustrated in FIG. 8, the heating unit 80 is provided in the reservoir 43, and the cooling unit 81 is provided in the downstream pipe 42*d*2 at the upstream side of the pump 44. Since the heating unit 80 is provided in the reservoir 43 in the middle of the pipe 42*d* as described above, the water-repellent agent may be securely heated to the first predetermined temperature and then supplied to the wafer W.

Further, since the upstream pipe 42*d*1 at the upstream side of the heating unit 80 is not required to be made of, for example, a heat-resistant material, the limitation on used parts may be reduced in the substrate processing system 1. In addition, the pipe 42*e* at the downstream side of the cooling unit 81, or the pump 44, the filter 45, the flow rate adjustor 46, the nozzle 41, and the recovery cup 50 are not required to be made of a heat-resistant material. Therefore, the limitation on parts used may be reduced. Further, in the third modification, the cooling unit 81 is provided in the downstream pipe 42*d*2, but not limited thereto. The cooling unit 81 may be provided in the pipe 42*e* in each processing unit 16.

<3-4. Fourth Modification>

Figure 9:
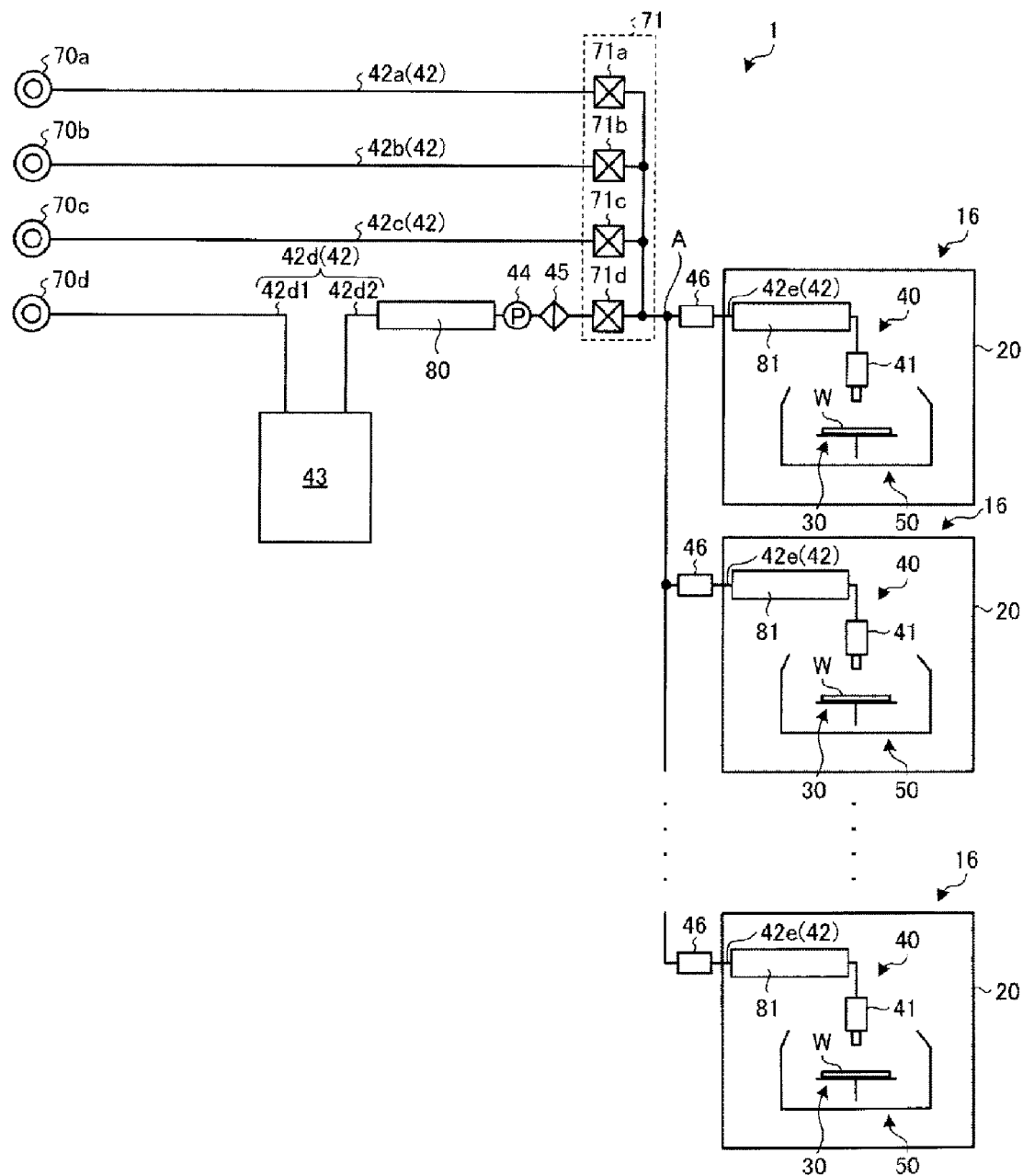
FIG. 9 is a schematic view illustrating a specific configuration example of a substrate processing system in a fourth modification.

In the fourth modification, as illustrated in FIG. 9, the heating unit 80 is provided in the downstream pipe 42*d*2 at the upstream side of the pump 44, and the cooling unit 80 is provided in the pipe 42*e* within each processing unit 16.

Therefore, since the upstream pipe 42*d*1 at the upstream side of the heating unit 80 is not required to be made of, for example, a heat-resistant material, the limitation on parts used may be reduced in the substrate processing system 1. Further, the pipe 42*e* at the downstream side of the cooling unit 81, or the nozzle 41 and the recovery cup 50 are not required to be made of a heat-resistant material. Therefore, the limitation on parts used may be reduced.

Further, the places to be provided with the heating unit 80 and the cooling unit 81 in the exemplary embodiment and the first to fourth modifications are merely illustrative, but not limited thereto. That is, as long as the water-repellent agent is heated and then cooled, the heating unit 80 and the cooling unit 81 may be provided in any places. For example, both the heating unit 80 and the cooling unit 81 may be provided in the upstream pipe 42*d*1 or the reservoir 43.

Further, in the exemplary embodiment and the first to fourth modifications, the heating unit 80 and the cooling unit 81 are provided, but not limited thereto. One or both of the heating unit 80 and the cooling unit 81 may be removed.

That is, the substrate processing system 1 may include the heating unit 80 only while the cooling unit 81 may be removed. In this case, the water-repellent agent, which is heated to the first predetermined temperature in the heating unit 80, is cooled to the second predetermined temperature by heat radiation through the pipe 42*d*, and then supplied to the wafer W. Therefore, the same effect as described above may be obtained.

Further, the substrate processing system 1 may include the cooling unit 81 only while the heating unit 80 may be removed. In this case, the water-repellent, which is already heated to the first predetermined temperature, is supplied from the water-repellent supply source 70*d* to the substrate processing system 1. Therefore, the same effect as described above may be obtained.

Further, the substrate processing system 1 may exclude both of the heating unit 80 and the cooling unit 81. In this case, the water-repellent, which is heated to the first predetermined temperature and then reaches the second predetermined temperature, is supplied from the water-repellent supply source 70*d* to the substrate processing system 1. Therefore, the same effect as described above may be obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   cooling a water-repellent agent heated to a first predetermined temperature to a second predetermined temperature;
   supplying the water-repellent agent that reaches the second predetermined temperature lower than the first predetermined temperature, to a substrate;
   supplying a rinse liquid to the substrate after the supplying the water-repellent agent; and
   removing the rinse liquid on the substrate after the supplying the rinse liquid thereby drying the substrate.

2. The substrate processing method of claim 1, further comprising:
   heating the water-repellent agent to the first predetermined temperature, before the cooling the water-repellent agent.

3. The substrate processing method of claim 1, wherein the second predetermined temperature is room temperature.

4. A substrate processing apparatus comprising:
   a water-repellent agent supply unit configured to supply a water-repellent agent to a substrate;
   a pipe connected to the water-repellent agent supply unit, and configured to supply the water-repellent agent to the water-repellent agent supply unit;
   a cooling unit provided in the pipe, and configured to cool the water-repellent agent;
   a rinse supply unit configured to supply a rinse liquid to the substrate; and
   a controller configured to perform: a water-repellency processing of supplying a water-repellent agent which is heated to a first predetermined temperature and then reaches a second predetermined temperature lower than the first predetermined temperature, to a substrate; a rinse processing of supplying a rinse liquid to the substrate after the water-repellency processing; and a dry processing of removing the rinse liquid on the substrate after the rinse processing,
   wherein the controller causes the cooling unit to cool the water-repellent agent heated to the first predetermined temperature, to the second predetermined temperature.

5. The substrate processing apparatus of claim 4, further comprising:
   a processing unit in which the water-repellent agent supply unit is accommodated and the water-repellency processing is performed,
   wherein the cooling unit is provided in the pipe within the processing unit.

6. The substrate processing apparatus of claim 4, further comprising:
   a processing unit accommodating the water-repellent agent supply unit therein and configured to perform the water-repellency processing,
   wherein the cooling unit is provided in the pipe between a water-repellent agent source and the processing unit.

7. The substrate processing apparatus of claim 6, further comprising:
   a reservoir provided in the pipe between the water-repellent agent source and the processing unit, and configured to reserve the water-repellent agent supplied from the water-repellent agent source,
   wherein the cooling unit is provided in the reservoir.

8. The substrate processing apparatus of claim 4, further comprising:
   a heating unit provided in the pipe, and configured to heat the water-repellent agent,
   wherein the controller causes the heating unit to heat the water-repellent agent to the first predetermined temperature.

9. The substrate processing apparatus of claim 8, further comprising:
   a processing unit accommodating the water-repellent agent supply unit therein and configured to perform the water-repellency processing,
   wherein the heating unit is provided in the pipe between a water-repellent agent source and the processing unit.

10. The substrate processing apparatus of claim 9, further comprising:
    a reservoir provided in the pipe between the water-repellent agent source and the processing unit, and configured to reserve the water-repellent agent supplied from the water-repellent agent source,
    wherein the heating unit is provided in the reservoir.

11. The substrate processing apparatus of claim 4, wherein the second predetermined temperature is room temperature.

* * * * *